US012756603B2

(12) United States Patent
Das et al.

(10) Patent No.: US 12,756,603 B2
(45) Date of Patent: Oct. 6, 2026

(54) PHASE MANAGEMENT CIRCUIT FOR HIGH-SPEED ADC RECEIVERS AND METHODS THEREOF

(71) Applicant: Samsung Electronics Co., Ltd., Suwon-si (KR)

(72) Inventors: Tamal Das, Bengaluru (IN); Gopinath Rayasam, Bengaluru (IN); Sanjeeb Kumar Ghosh, Bengaluru (IN); Saikat Hazra, Bengaluru (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 42 days.

(21) Appl. No.: 18/953,479

(22) Filed: Nov. 20, 2024

(65) Prior Publication Data

US 2026/0095353 A1 Apr. 2, 2026

(30) Foreign Application Priority Data

Oct. 1, 2024 (IN) ............................ 202441074436

(51) Int. Cl.
*H04L 25/49* (2006.01)
*H03L 7/093* (2006.01)

(52) U.S. Cl.
CPC .......... *H04L 25/4921* (2013.01); *H03L 7/093* (2013.01)

(58) Field of Classification Search
CPC ............................ H03L 7/093; H04L 25/4921
See application file for complete search history.

(56) References Cited

U.S. PATENT DOCUMENTS

| | | | | |
|---|---|---|---|---|
| 7,020,227 | B1 * | 3/2006 | Wang | H04L 7/0337 375/360 |
| 9,225,324 | B2 | 12/2015 | Arcudia et al. | |
| 12,249,990 | B1 * | 3/2025 | Pike | H03K 3/017 |
| 2022/0014205 | A1 * | 1/2022 | Petrov | H03L 7/1974 |

FOREIGN PATENT DOCUMENTS

| | | | |
|---|---|---|---|
| CN | 116260453 | A | 6/2023 |
| KR | 10-1694926 | B1 | 1/2017 |
| TW | 2013-20611 | A | 5/2013 |

OTHER PUBLICATIONS

Y. Segal, et al., "A 1.41pJ/b 224Gb/s PAM-4 SerDes Receiver with 31dB Loss Compensation," 2022 IEEE International Solid-State Circuits Conference, Feb. 20-26, 2022.

* cited by examiner

*Primary Examiner* — David S Huang
(74) *Attorney, Agent, or Firm* — Fish & Richardson P.C.

(57) ABSTRACT

Embodiments herein disclose a phase control circuit for a high-speed ADC clock receiver in a PAM4 receiver comprises of, a plurality of Current-Mode Logic (CML) IQ dividers, a plurality of phase interpolators, and a detector circuit, wherein the detector circuit determines phase relation between plurality of clock signals from the plurality of CML IQ dividers and control inputs of the plurality of phase interpolators in a clock data recovery loop based on the determined phase relation.

12 Claims, 18 Drawing Sheets

| I_CLK | Q_CLK | Quadrant |
|---|---|---|
| 1 | 1 | 1st |
| 0 | 1 | 2nd |
| 0 | 0 | 3rd |
| 1 | 0 | 4th |

| I_CLK | Q_CLK | Quadrant |
|---|---|---|
| 1 | 1 | 3rd |
| 0 | 1 | 4th |
| 0 | 0 | 1st |
| 1 | 0 | 2nd |

PHASE MANAGEMENT CIRCUIT FOR HIGH-SPEED ADC RECEIVERS AND METHODS THEREOF

CROSS-REFERENCE TO RELATED APPLICATIONS

This application is based on and claims priority under 35 U.S.C. § 119 to Indian Patent Application No. 202441074436, filed on Oct. 1, 2024, in the Indian Intellectual Property Office, the disclosures of each of which are incorporated by reference herein in their entireties.

BACKGROUND

Field

Embodiments disclosed herein relate to high-speed Analog-to-Digital Converter (ADC) clock receivers, and more particularly to a circuit for managing phase sequence for a high-speed ADC clock receiver in a pulse-amplitude modulation (PAM) receiver.

Description of the Related Art

More specifically, the embodiments herein include a circuit for managing phase for a high-speed ADC clock receiver in a pulse-amplitude modulation (PAM, e.g., PAM4) receiver, wherein the circuit comprises a plurality of current-mode logic (CML) IQ dividers, a plurality of phase interpolators, and a detector circuit for determining a phase relationship between a plurality clock signals from the plurality of CML IQ dividers.

Another object of the embodiments herein is to disclose a circuit for managing phase for high-speed ADC clock by controlling the inputs of the phase interpolator in clock and data recovery (CDR) loop based on the determined phase relation.

SUMMARY

Accordingly, the embodiments herein provide a circuit for managing phase for a high-speed ADC clock receiver in a PAM receiver comprises, one or more Current-Mode Logic (CML) in-phase/quadrature (IQ) dividers; a plurality of phase interpolators; one or more CML to Complementary Metal-Oxide-Semiconductor (CMOS) converters connected to an output of at least one of the plurality of phase interpolator; and a detector circuit. The detector circuit may be configured to determine a phase relation between a plurality of clock signals received from the one or more CML IQ dividers. The one or more CML IQ dividers may be configured to operatively control the plurality of phase interpolators. The plurality of phase interpolators may be configured to generate at least one complementary clock with a phase in one of four quadrants, wherein the phase depends on the phase range of the plurality of clock signals.

Accordingly, the embodiments herein provide a method for managing phase for a high-speed clock for an analog-to-digital-converter-digital signal processor (ADC-DSP) based receiver in a pulse-amplitude modulation (PAM) receiver comprises determining, by a detector circuit, a phase relation between a plurality of clock signals received from a plurality of Current-Mode Logic (CML) IQ dividers and controlling by the detector circuit, inputs of a plurality of phase interpolators in a Clock and Data Recovery (CDR) loop based on the determined phase relation.

These and other aspects of the embodiments herein will be better appreciated and understood when considered in conjunction with the following description and the accompanying drawings. It should be understood, however, that the following descriptions, while indicating at least one embodiment and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

Embodiments herein are illustrated in the accompanying drawings, throughout which like reference letters indicate corresponding parts in the various figures. The embodiments herein will be better understood from the following description with reference to the following illustratory drawings. Embodiments herein are illustrated by way of examples in the accompanying drawings, and in which.

DETAILED DESCRIPTION

Figure 1A:
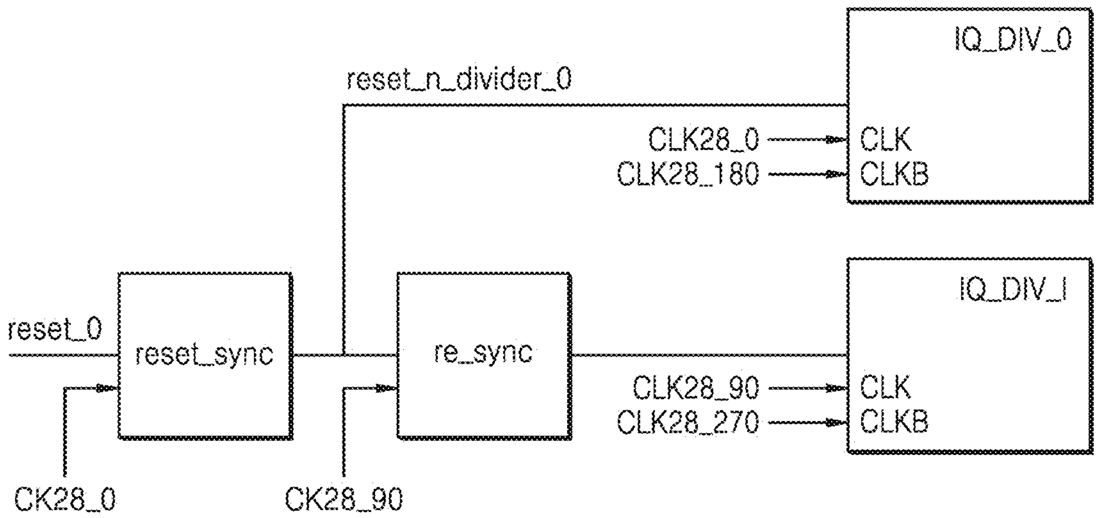
FIG. 1A depicts a generic ADC clock receiver circuit synchronized resets for 2 dividers, according to some comparative examples.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

For the purposes of interpreting this specification, the definitions (as defined herein) will apply and whenever appropriate the terms used in singular will also include the plural and vice versa. It is to be understood that the terminology used herein is for the purposes of describing particular embodiments only and is not intended to be limiting. The terms "comprising", "having", and/or "including" are to be construed as open-ended terms unless otherwise noted.

The words/phrases "exemplary", "example", "illustration", "in an instance", "and/or the like", "and so on", "etc.", "etcetera", "e.g.," and/or, "i.e.," are merely used herein to mean "serving as an example, instance, or illustration." Any embodiment or implementation of the present subject matter described herein using the words/phrases "exemplary", "example", "illustration", "in an instance", "and/or the like", "and so on", "etc.", "etcetera", "e.g.,", "i.e.," is not necessarily to be construed as preferred or advantageous over other embodiments.

Embodiments herein may be described and illustrated in terms of blocks which carry out a described function or functions. These blocks, which may be referred to herein as managers, units, modules, hardware components, and/or the like, and may be enabled by and/or included in processing circuitry. The processing circuitry may be physically implemented by analog and/or digital circuits such as logic gates, integrated circuits, microprocessors, microcontrollers, memory circuits, passive electronic components, active electronic components, optical components, hardwired circuits and/or the like, and may optionally be driven by firmware. The circuits may, for example, be embodied in one or more semiconductor chips, or on substrate supports such as printed circuit boards and/or the like. The circuits constituting a block may be implemented by dedicated hardware, or by a processor (e.g., one or more programmed microprocessors and associated circuitry such as a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.)), and/or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

It should be noted that elements in the drawings are illustrated for the purposes of this description and for ease of understanding; and therefore may not have necessarily been drawn to scale. For example, the flowcharts/sequence diagrams illustrate the method in terms of the steps required for understanding of aspects of the embodiments as disclosed herein. Furthermore, in terms of the construction of the device, one or more components of the device may have been represented in the drawings by conventional symbols, and the drawings may show only those specific details that are pertinent to understanding the present embodiments so as not to obscure the drawings with details that will be readily apparent to those of ordinary skill in the art having the benefit of the description herein. Furthermore, in terms of the system, one or more components/modules which comprise the system may have been represented in the drawings by conventional symbols, and the drawings may show only those specific details that are pertinent to understanding the present embodiments so as not to obscure the drawings with details that will be readily apparent to those of ordinary skill in the art having the benefit of the description herein.

The accompanying drawings are used to help easily understand various technical features and it should be understood that the embodiments presented herein are not limited by the accompanying drawings. As such, the present disclosure should be construed to extend to any modifications, equivalents, and substitutes in addition to those which are particularly set out in the accompanying drawings and the corresponding description. Usage of words such as first, second, third etc., to describe components/elements/steps is for the purposes of this description and should not be construed as sequential ordering/placement/occurrence unless specified otherwise.

An ADC-based receiver for a PAM system (e.g., PAM4 SerDes) may include multi-phase high-speed clocks to achieve improved and/or optimal performance. For example, a 28 gigahertz (GHz) phase locked loop (PLL) may be used to generate and distribute 28 GHz current mode logic (CML) clocks in the PAM4 SerDes, ensuring reduced and/or minimal jitter, stable signal processing and minimal power for the transceiver system. For Serializer/Deserializer (SerDes) systems, the transmitter and receiver require clocks derived from a single Phase-locked loop (PLL). Typically, the PLL is designed for the highest feasible frequency, often not exceeding 28 GHz for the transmitter. This single PLL provides the clock signal for both the transmitter and receiver, eliminating the need for separate PLLs.

However, receivers may face constraints which prevent the direct use of a 28 GHz clock. For example, for Non-Return to Zero (NRZ) signaling, which has two levels, a half-rate or quarter-rate clock is often used depending on timing margins; in such instances, a 56 Gbps NRZ transceiver would use a 28 GHz clock. However, as data rates increase to 100 Gbps or 224 Gbps, clock frequency cannot simply be increased due to timing limitations. In the case of PAM4 ADC-based receivers (where ADC performance depends on bandwidth and frequency), multiple ADCs may be employed to handle data streams at increased data rates. This requires time-domain multiplexing, typically necessitating multiple clock phases.

For example, an 8-phase 14 GHz clock may be utilized to achieve the timing and synchronization for high-speed data processing at 224 Gbps. This high-frequency clock is crucial for the time-interleaved sub-ADC and Track-and-Hold (TnH) circuits, which require multi-phase 14 GHz clocks for accurate sampling. Clock recovery aligns the 14 GHz clock with the incoming data using a phase interpolator based clock-data recovery system. To achieve the necessary multi-phase 14 GHz clock signals, the system employs a pair of high-speed IQ dividers and four phase interpolators, generating eight distinct 14 GHz phases that facilitate efficient time-interleaving in the sub-ADC, thus enhancing the overall data acquisition and processing capabilities of the receiver.

FIG. 1A depicts a generic ADC clock receiver circuit synchronized resets for 2 dividers, according to some such comparative examples.

More specifically, FIG. 1A depicts IQ (in-phase/quadrature) dividers with a synchronized reset. Once reset is de-asserted, the single IQ-divider are configured to generate 4 phases of divided clocks with each 90-degree apart from each other. If reset de-asserted at positive level of clock (CK), divided output clock starts at next negative level of CLK. If a single reset is used in non-accordance to reset removal, two scenarios of phase relationships are possible between two sets (CK14_0,180,90,27) and (CK14_45,225, 135,315).

Figure 1B:
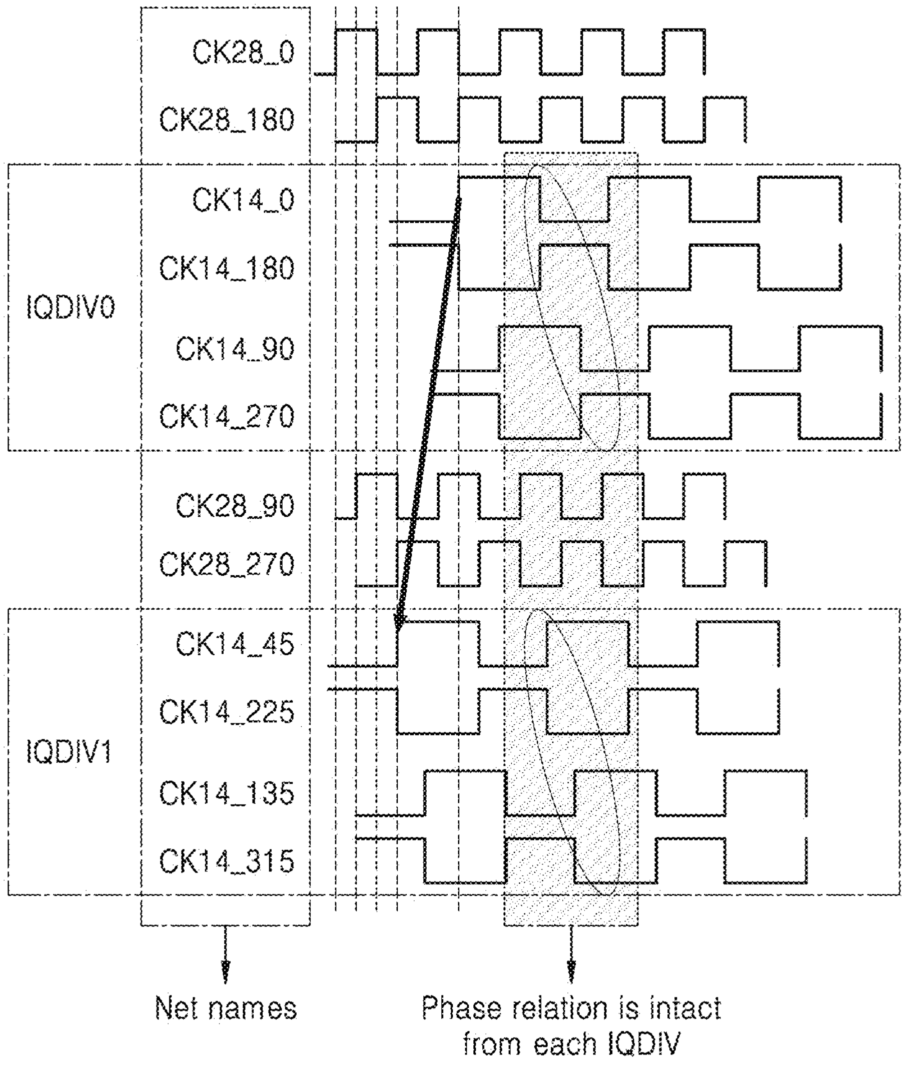
FIG. 1B depicts a timing diagram of synchronized resets for 2 dividers where phase relation is intact from each IQDIV, according to some comparative examples.

FIG. 1B depicts a timing diagram of synchronized resets for 2 dividers where phase relation is intact from each IQDIV. Distinct phase relations can be received across all 8 phases if 2 separate reset signals are synced with CK28_0 and CK28_90). At 28 GHz clock domain, the synchronization window will be 8 ps (picoseconds) for CK28_0 to CK28_90.

Figure 2A:
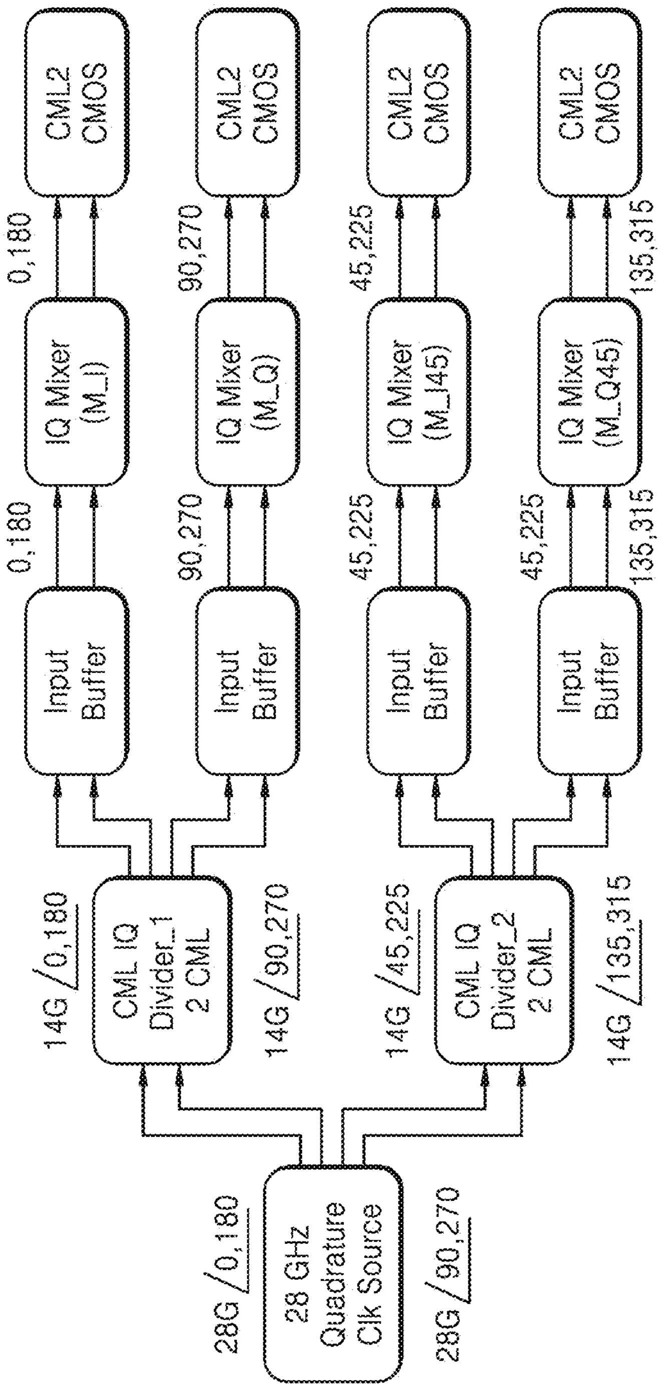
FIG. 2A shows a basic implementation of a RX-PI block diagram for 4×14 GHz Mixer in 8 Phases, according to some comparative examples.
Figure 2B:
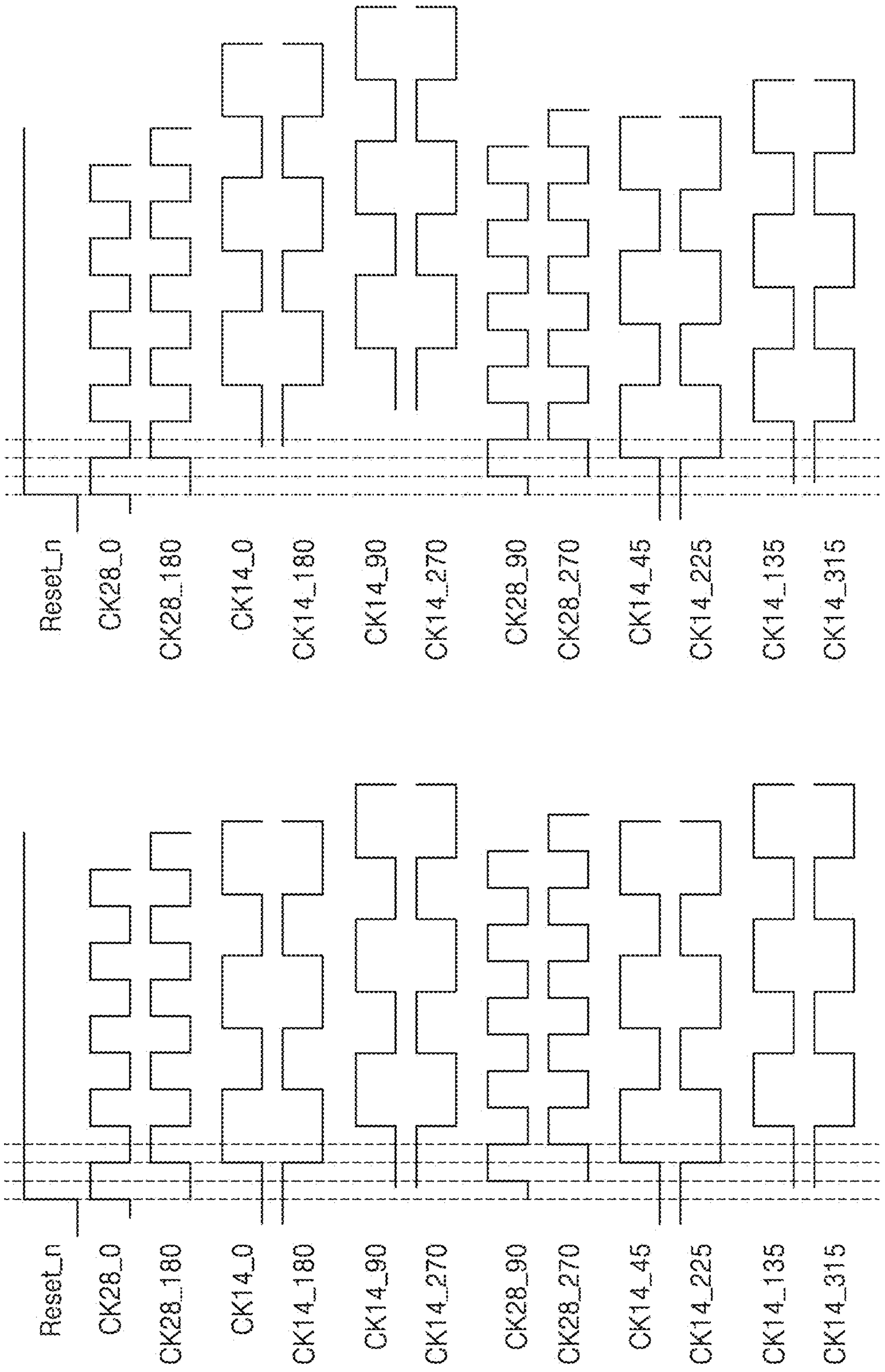
FIG. 2B shows a timing diagram of synchronized single reset signal to C28_0, according to some comparative examples.
Figure 2C:
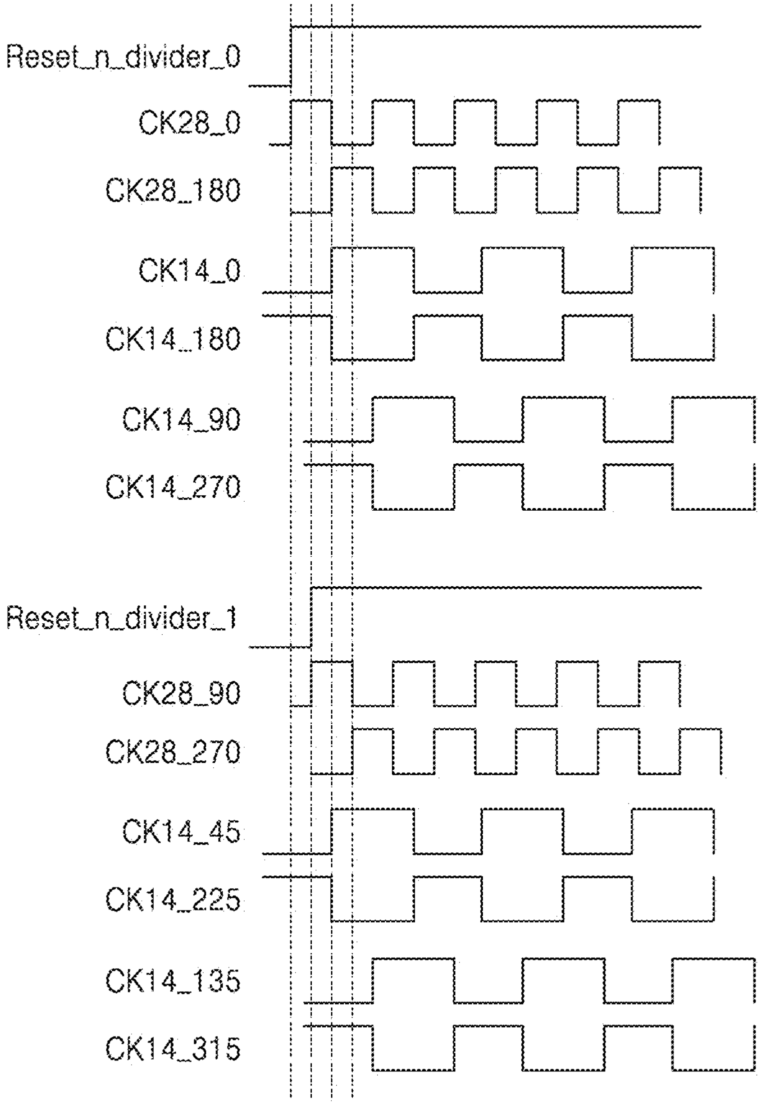
FIG. 2C shows a timing diagram of synchronized separate reset signal with C28_0 and C28_90 (followed by C28_0), according to some comparative examples.
Figure 3A:
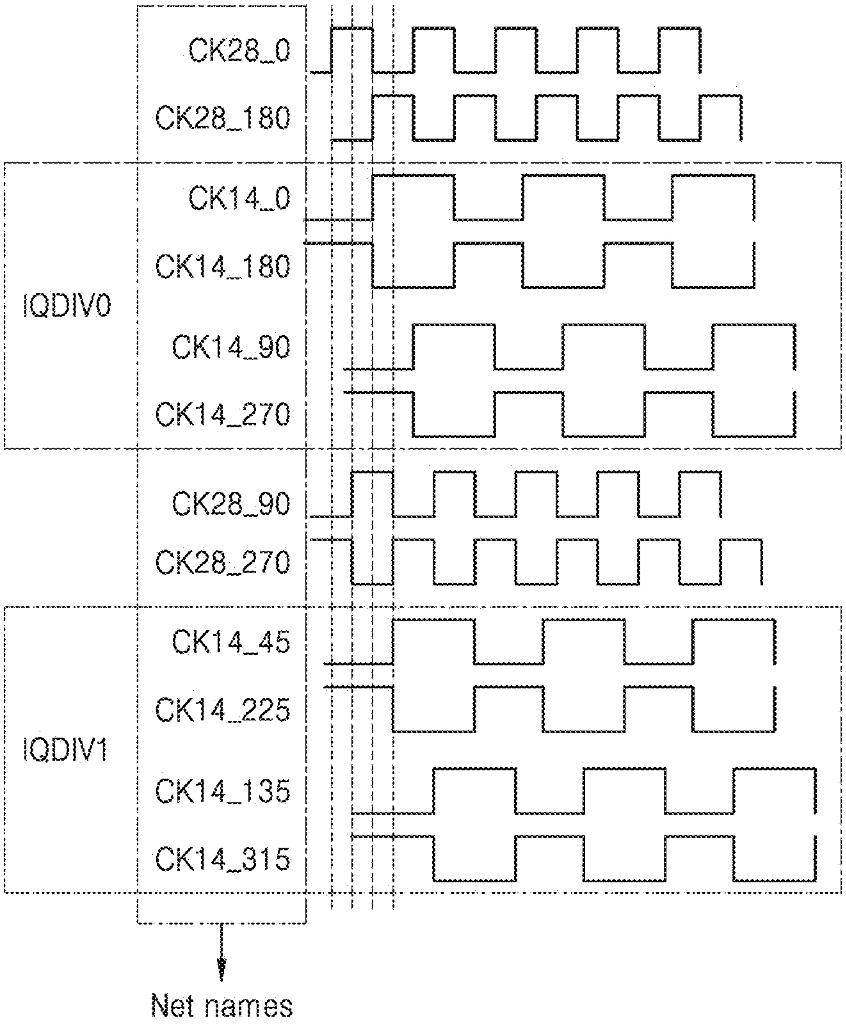
FIG. 3A shows a timing diagram of RX-PI output clock sequence, according to some comparative examples.
Figure 3B:
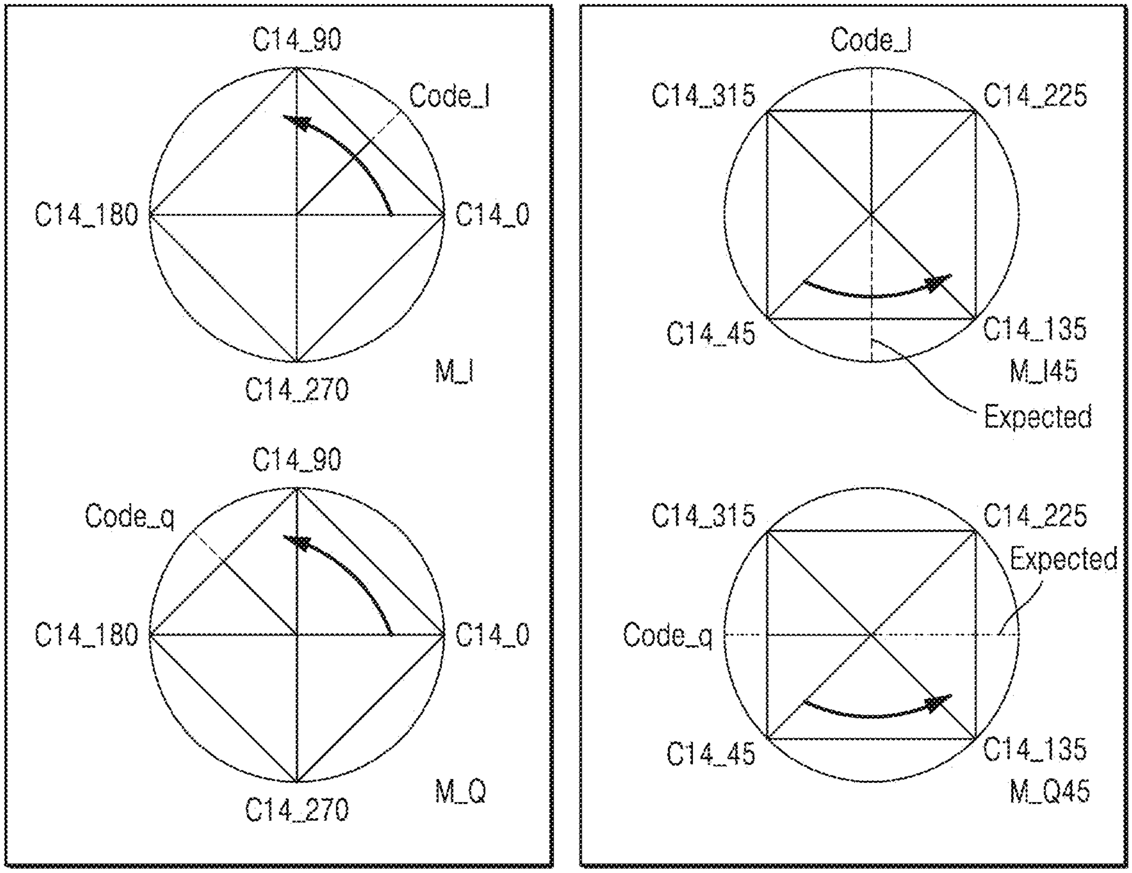
FIG. 3B shows a clock mapping of RX-PI output clock sequence for 14 GHz clock phase, according to some comparative examples.
Figure 3C:
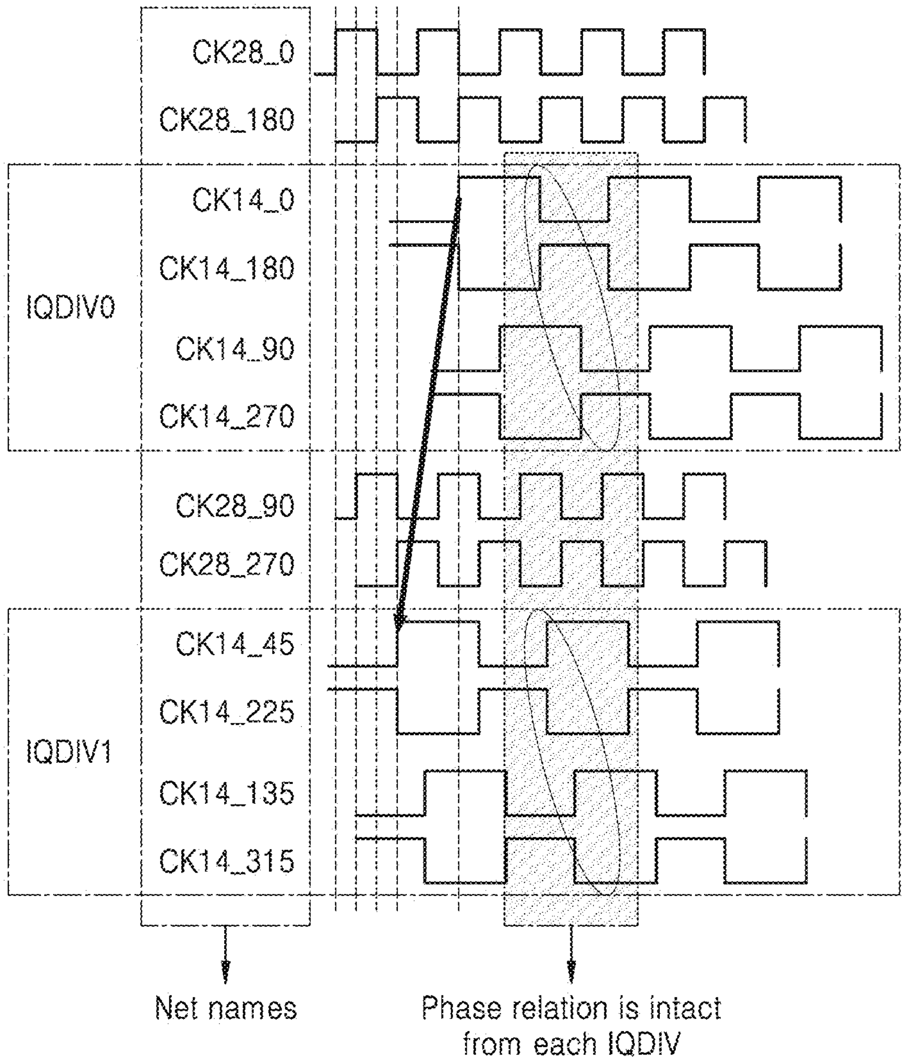
FIG. 3C shows a timing diagram of RX-PI output clock sequence for 28 GHz clock phase, according to some comparative examples.
Figure 3D:
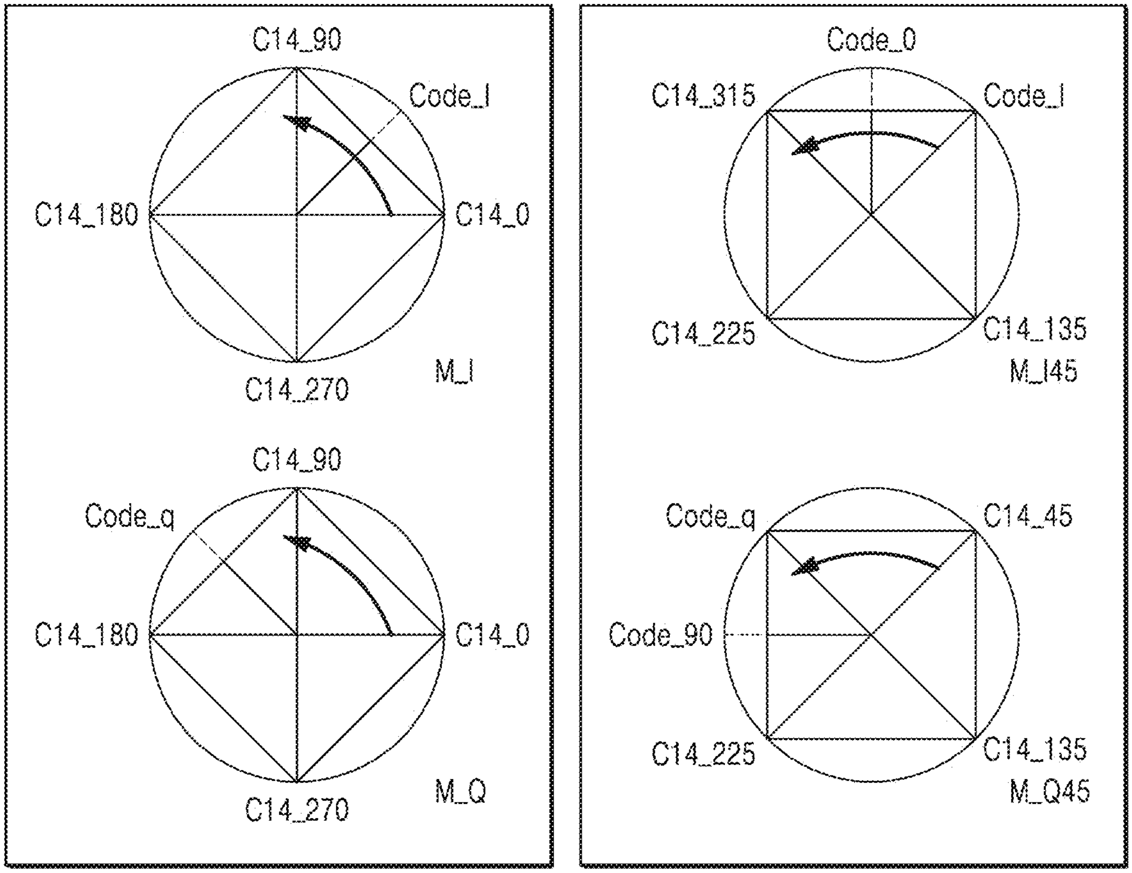
FIG. 3D shows a clock mapping of RX-PI output clock sequence for 28 GHz clock phase, according to some comparative examples.

FIG. 2A depicts a basic implementation of an RX-PI block diagram for 4×14 GHz Mixer for 8 Phases. An implementation of an RX-PI (Receive-Phase Interpolator) block diagram for a 4×14 GHz mixer for 8 phases involves generating eight evenly spaced phase signals from a 14 GHz clock. The outputs of the mixers are then combined in a way that constructs the desired intermediate phase signal. The phase interpolation ensures accurate phase alignment, which is crucial for maintaining signal integrity and performance at high frequencies. This setup leverages more precise timing control and phase adjustments to achieve the desired mixing and signal processing. The ADC-based PAM4 receiver requires multi-phase high-speed clocks for its time-interleaved sub-ADC but generating these phases directly from phase locked loops (PLL) is not feasible due to the complexity of phase relationships. FIGS. 2B and 2C depicts a timing diagram of synchronized single reset signal to C28_0 and separate reset signal with C28_0 and C28_90 (followed by C28_0) respectively. The timing diagram illustrating a synchronized single reset signal to C28_0 and separate reset signals for C28_0 and C28_90 (followed by C28_0) shows the relationship between these signals over time. In the synchronized single reset scenario, a single reset pulse aligns with the C28_0 clock signal, ensuring all related circuits reset simultaneously. For the separate reset signals, FIGS. 2B and 2C depict a reset pulse aligned first with C28_0, followed by another reset pulse aligned with the C28_90 signal, which is 90 degrees out of phase with C28_0. The timing diagram demonstrates the sequence and phase relationship between these signals, highlighting how the resets occur at different intervals to achieve specific timing requirements for the system.

In current mode logic (CML) systems, which are inherently differential, handling high frequencies can complicate the design of dividers. Complementary metal-oxide-semiconductor (CMOS) dividers are particularly frail and less preferred at such high frequencies, like 28 GHz, because driving a 28 GHz signal with CMOS logic is challenging. Therefore, quadrature clock sources at 28 GHz typically utilize CML due to its better performance at high frequencies with lower signal swings. When incorporating a divider, the four phases of a 28 GHz clock would break into phases like (0, 180) and (90, 270). In a divider using master-slave latches in D-flip-flops, the latch outputs are divided clocks that maintain a 90-degree phase difference. Specifically, the master stage output lags by 90 degrees, while the slave stage output leads by 90 degrees. This phase relationship, combined with the differential nature of CML, ensures more precise timing and synchronization essential for high-speed operations. Therefore, improving signal integrity and/or preventing (and/or reducing) unintended interference in signals resulting from mismatched timing.

In an example, for a 224G PAM4 ADC, 8 or 16 phases of 12 GHz or 6 GHz clocks are needed, while the same physical layer transmitter (PHY's TX) section may require 4 phases of 28 GHz clocks for better jitter performance with timing robustness. FIGS. 3A, 3B, 3C, and 3D depict a timing diagram of RX-PI output clock sequence, a clock mapping of RX-PI output clock sequence for 14 GHz clock phase, a timing diagram of RX-PI output clock sequence for 28 GHz clock phase, and a clock mapping of RX-PI output clock sequence for 28 GHz clock phase respectively. The timing diagram of an RX-PI (Receive-Phase Interpolator) output clock sequence illustrates the precise phases of the output clock signals over a period. For a 14 GHz clock phase, the clock mapping shows the RX-PI generating multiple evenly spaced phases, typically eight, corresponding to 45-degree intervals. The timing diagram displays these phases over time, demonstrating the cyclical nature of the signal. When considering a 28 GHz clock phase (e.g., effectively doubling the frequency), the RX-PI output clock sequence similarly produces evenly spaced phases but at a 28 GHz rate. The clock mapping for the 28 GHz phase shows a denser distribution of phase signals, with each phase now spaced at 22.5 degree intervals. This timing diagram reveals how the RX-PI adapts to higher frequency requirements by maintaining precise phase relationships crucial for high-speed signal processing applications. The optimal solution for the PLL is a 4-phase 28 GHz Voltage-Controlled Oscillator (VCO). Therefore, IQ dividers are used to derive the necessary multi-phase clocks from the 28 GHz source. However, for effective Clock Data Recovery (CDR), these multi-phase clocks must be fine-tuned using phase interpolators.

A significant challenge is maintaining the precise phase relationship between clocks output by different IQ dividers, and developing a synchronized 28 GHz CML-IQ-divider robust enough to handle this requirement is particularly difficult. Multiple mixers are used, if the clock signals are not correctly aligned and these misaligned signals are mixed and passed through an inverter, the output of the inverter can reveal information about the clock positioning. By varying the strength of the inverter, changes in the mixed signals can be observed, which helps in identifying the correct clock positions. This process involves mixing all the clock signals to generate informative outputs about their alignment. Correct clock positioning is essential to ensure accurate data conversion and timing synchronization between the CML and CMOS domains.

In another scenario, when using two IQ dividers, the first divider generates clock phases at 0 and 180 degrees, while the second divider ideally generates phases at 45 and 225 degrees. However, there is no guarantee that the second divider will precisely achieve a 45-degree phase shift due to timing uncertainties. The reset mechanism for these clocks plays a crucial role in phase alignment. Ideally, the reset signal ensures that the clocks start at the correct phase positions upon the next positive edge of the clock. However, if both dividers share the same reset and the reset duration is too long, it can lead to misalignment, causing the 45-degree phase to lead instead of lag. This misalignment disrupts the intended phase relationship, potentially compromising the system's functionality.

Therefore, the embodiments herein achieve a circuit for managing phase for a high-speed ADC clock receiver in a PAM4 receiver. Referring now to the drawings, and more particularly to FIGS. 4 through 8, where similar reference characters denote corresponding features consistently throughout the figures, there are shown embodiments.

Embodiments herein disclose a phase sequence control circuit for a high-speed ADC clock receiver in, e.g., a PAM4 receiver. The phase control circuit comprises a plurality of current-mode logic (CML) IQ dividers, a plurality of phase interpolators, and a detector circuit. The detector circuit is configured to determine a phase relation between a plurality of clock signals from the plurality of CML IQ dividers and control inputs of the plurality of phase interpolators in a clock and data recovery (CDR) loop based on the determined phase relation.

Embodiments herein disclose a setup with two IQ dividers, wherein each IQ divider generates two pairs of complementary clock phases; a first IQ divider produces phases C28_0 and C28_180, and the second IQ divider produces C28_90 and C28_270. Each IQ divider drives two phase interpolators (or mixers), with each interpolator receiving four clock inputs spanning either from 0 to 270 degrees (from IQDIV0) or from 45 to 315 degrees (from IQDIV1). The phase interpolators are configured to generate complementary clocks with phases adjustable within the input clock range, allowing for phase generation in any of the four quadrants. Phase control bits from the Clock Data Recovery (CDR) system are configured to adjust the phase within a quadrant, while quadrant selection control from the CDR enables shifting the phase from one quadrant to another. The final output comprises of eight phases, named C14_0, C14_45, C14_90, C14_135, C14_180, C14_225, C14_270, and C14_315, which are essential for the high-speed ADC operation in the receiver.

Figure 4:
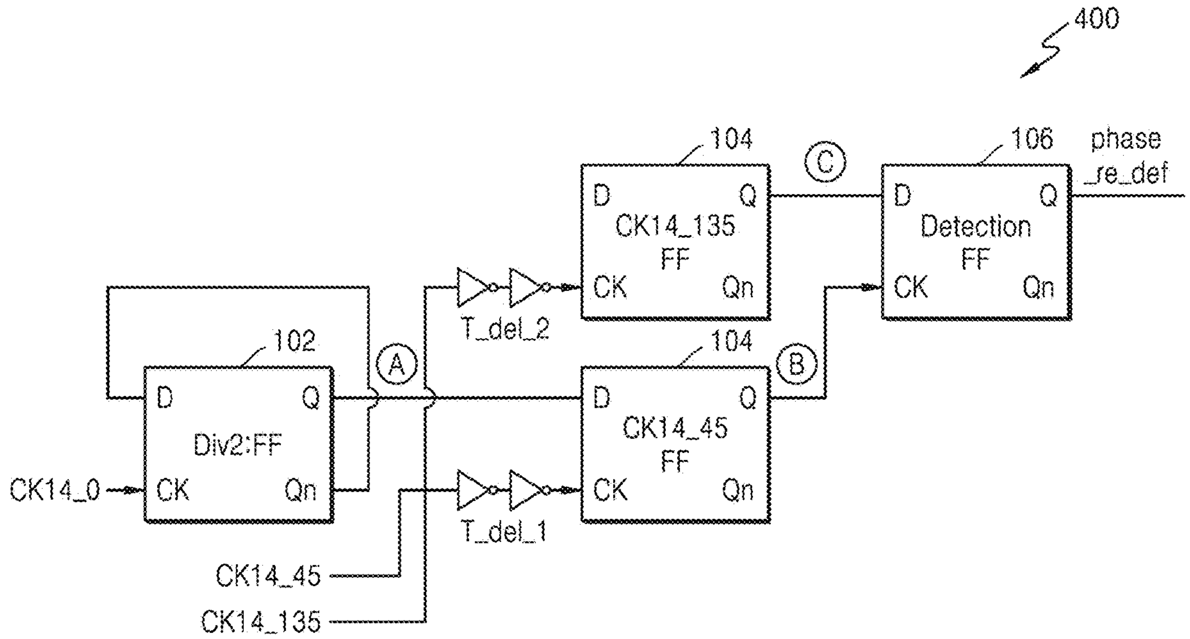
FIG. 4 depicts a phase sequence circuit for a high-speed ADC clock phases in a PAM4 receiver, according to some example embodiments as disclosed herein.

FIG. 4 depicts a phase sequence circuit (400) for a high-speed ADC clock receiver in a PAM4 receiver. The phase sequence detection for high-speed ADC clock receiver for PAM4 receiver comprises one or more current-mode logic (CML) IQ dividers (102), a plurality of phase interpolators (104), and a detector circuit (106). The phase sequence circuit (400) may further include at least one of a plurality of CML to Complementary Metal-Oxide-Semiconductor (CMOS) converters (see 108 of FIG. 7). The one or more CML IQ dividers (102) are configured to operatively control the plurality of phase interpolators (104). The plurality of phase interpolators (104) are functionally connected to a plurality of clocks and configured to generate a complementary clock in a predefined phase range in the input clock in the predicted plurality of quadrants, wherein the plurality of clocks and the complementary clocks are configured to be used to determine the phase relation among the predefined phase range in the input clock signals coming from the plurality of CML IQ dividers (102) (as discussed in further detail below). In at least one embodiment herein, the one or more CML IQ dividers (102) can be two (2) Current-Mode Logic (CML) IQ dividers: a first CML IQ divider hereinafter referred to as C28_0, C28_180 & a second CML IQ divider hereinafter referred to as C28_90, C28_270. The CML IQ dividers are configured to operatively control two phase interpolators (104). As the detector is at an CMOS operating level but the IQ dividers and Phase interpolators are at CML operating levels, the plurality of CML to CMOS converters (108) may be used to convert the output of the CML to the CMOS level. As shown in the illustration, a D-flip-flop (FF), the inverting output (denoted as "Q" representing a Q-bar) can be used for creating a clock division of 2. Here, the D-flip-flop is re-timed, with outputs labeled as C and B representing the clock signals. The output Q is derived from a divided version of the original clock signal, CK14. To achieve specific phase shifts, CK14 is sampled at 45 degrees (CK14_45) and/or 135 degrees (CK14_135) using another flip-flop iteratively, producing the outputs B and C. This setup helps in phase detection and alignment in a detector circuit, which operates within the CMOS domain, utilizing D-flip-flops for more precise timing and synchronization of clock signals.

Figure 5A:
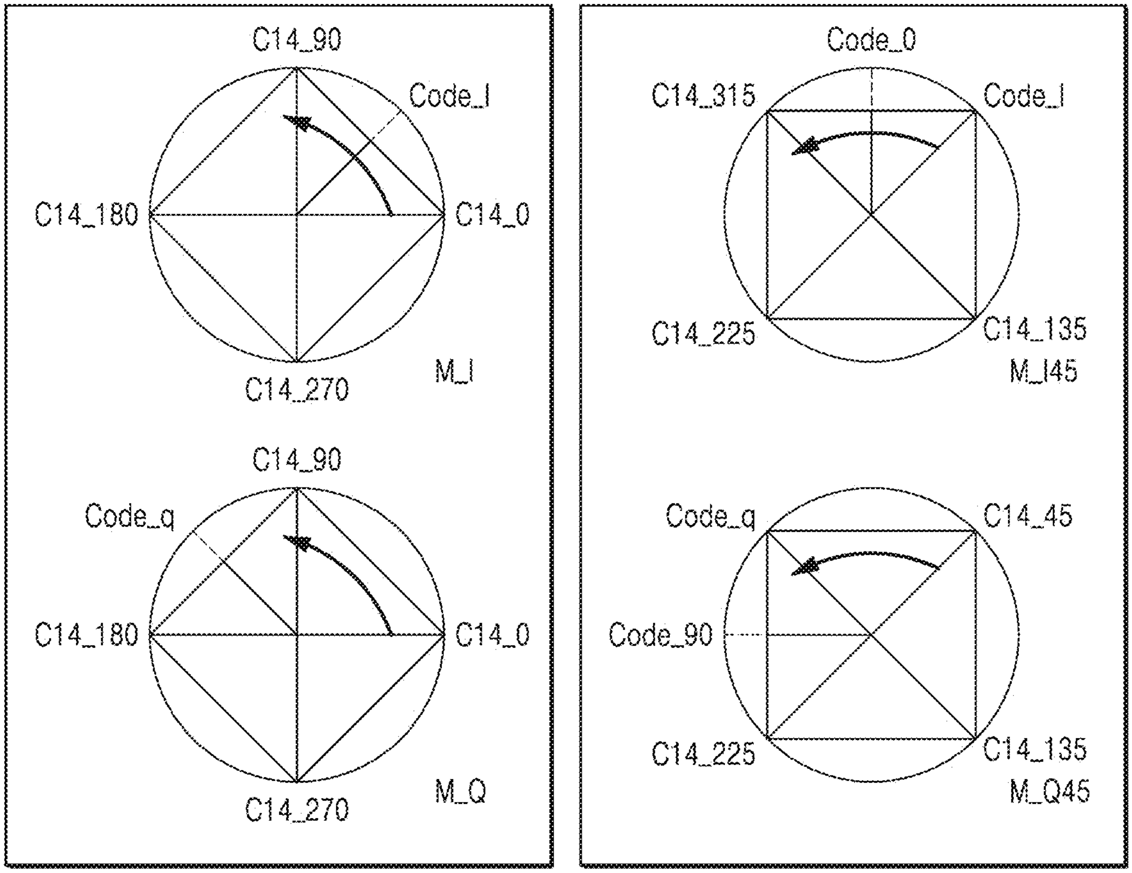
FIG. 5A depicts a clock mapping for a high-speed ADC clock phases in a PAM4 receiver, according to some example embodiments as disclosed herein.

FIG. 5A depicts a clock mapping for a high-speed ADC clock receiver in a PAM4 receiver. The phase interpolator CMOS level outputs are configured to be used to detect the phase sequence. In an embodiment herein, the quadrature clock sources at 28 GHz can utilize current mode logic (CML) due to its better performance at high frequencies and lower signal swings. When incorporating a divider, the four phases of a 28 GHz clock can break into phases like (0, 180) and (90, 270). The detector circuit is configured to check if C14_45 is in between C14_0 and C14_180 (e.g., corresponding to lag), and/or in between C14_180 and C14_180 and C14_0 (e.g., corresponding to lead). In a divider using master-slave latches in D-flip-flops, the latch outputs can be divided into clocks that maintain a 90-degree phase difference. Specifically, the master stage output lags by 90 degrees, while the slave stage output leads by 90 degrees. This phase relationship can be combined with the differential nature of CML, ensuring more precise timing and synchronization essential for high-speed operations. The phase interpolators can be functionally connected to four clocks, wherein the clocks are spreading either from 0 to 270 degree from IQDIV0 or 45 degrees to 315 degrees from IQDIV1. The eight phase outputs are named C14_0, C14_45, C14_90, C14_135, C14_180, C14_225, C14_270, and C14_315. The phase interpolators can generate a complementary clock with a phase anywhere in the input clock phase range (e.g., the phase can be anywhere in the four quadrants). Clock mapping for a high-speed ADC clock receiver in a PAM4 receiver involves utilizing phase interpolator CMOS level outputs to detect phase sequences. The detector circuit determines whether C14_45 falls between C14_0 and C14_180 (e.g., indicating a lag), or between C14_180 and C14_0 (e.g., indicating a lead). The phase interpolators can be linked to four clocks spreading from 0 to 270 degrees from IQDIV0 or 45 to 315 degrees from IQDIV1. These interpolators produce eight phase outputs (C14_0, C14_45, C14_90, C14_135, C14_180, C14_225, C14_270, C14_315), enabling the generation of complementary clocks with phases spanning the input clock phase range, thus covering all four quadrants.

Figure 5B:
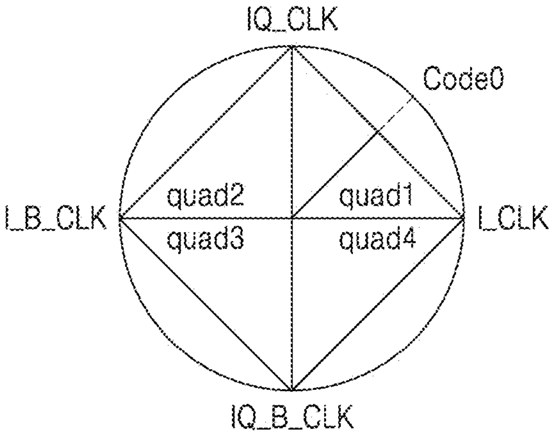
FIGS. 5B and 5C depicts a clock mapping for RX-PI Mixer quadrant mapping, according to some example embodiments as disclosed herein.
Figure 5C:
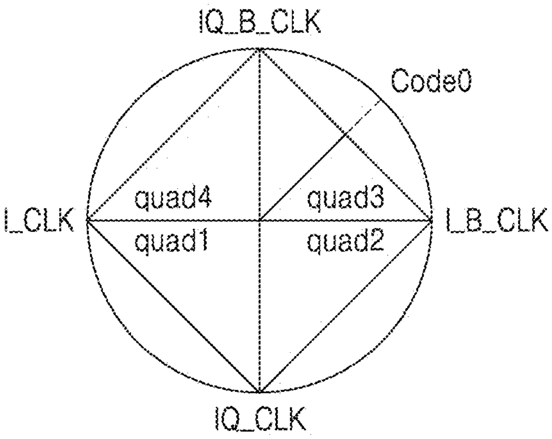

FIGS. 5B and 5C depict a clock mapping for RX-PI Mixer quadrant mapping. The two IQ dividers can drive 2 phase interpolators (or mixer). The phase interpolator CMOS level outputs can be used to detect the phase sequence. The final 8 phase outputs can be named as: C14_0, C14_45, C14_90, C14_135, C14_180, C14_225, C14_270, C14_315. The phase relationship between two IQ dividers for the same mixer code (mixer0) can have either 45-degree phase relation with mixer2 or 225-degree phase. FIGS. 5B and 5C depict quadrant mapping wherein the IQ dividers can be in phase or out of phase, and the quadrant mapping can be used for quadrant re-mapping. Clock mapping for RX-PI (Receiver Phase Interpolator) Mixer quadrant mapping can involve utilizing two IQ dividers to drive two phase interpolators or mixers. These interpolators produce CMOS level outputs, which can be used for detecting the phase sequence. The resulting eight phase outputs can be labeled C14_0 through C14_315. For a mixer with the code "mixer0", the phase relationship between the two IQ dividers can either be 45 degrees or 225 degrees. Understanding whether the IQ dividers are in phase or out of phase enables quadrant re-mapping, allowing for efficient management of the mixer's phase characteristics based on known information about the IQ dividers'behavior. The clock mapping for RX-PI Mixer quadrant mapping can involve organizing the phase information of incoming signals into quadrants for accurate phase interpolation and signal demodulation in radio receivers. The process can be crucial for the proper functioning of a Phase Interpolator (PI) in the receiver (RX) chain, particularly for mixers which are used to down convert the received signal to a lower frequency. By dividing the phase cycle into quadrants, the system are configured to effectively map the continuous phase variations into discrete intervals, enhancing the precision of the phase adjustment and ensuring the accurate recovery of the original signal's information. This method can help in achieving better performance in terms of phase noise and signal integrity, which are critical for high-frequency communication systems.

Figure 5D:
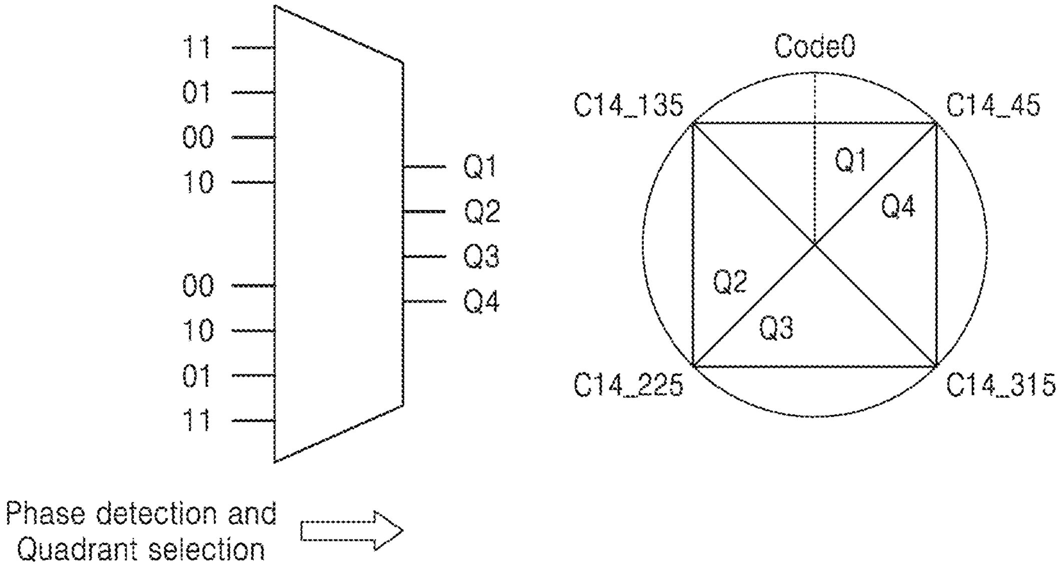
FIG. 5D depicts a clock mapping for RX-PI Mixer for phase detection and quadrant selection, according to some example embodiments as disclosed herein.

FIG. 5D depicts a clock mapping for RX-PI Mixer for phase detection and quadrant selection. The phase relationship among 4 phases out of a single IQ divider is always constant and is 90 degrees. There can only be two possibilities of phase relationships between (C14_0, C14_180, C14_90, C14_270) and (C14_45, C14_225, C14_135, C14_315) phase relation. The complementary clock is configured to be moved from a first quadrant to a second quadrant, based on a quadrant selection control from the CDR. The quadrant mapping is configured to be changed for one of the mixers'set if the current relationship between these 2 sets can be known. The clock mapping for Receiver Phase Interpolator (RX-PI) Mixer can involve phase detection and quadrant selection, where the phase relationship among four phases from a single IQ divider remains constant at 90 degrees. Two possibilities exist for the phase relationships between sets (C14_0, C14_180, C14_90, C14_270) and (C14_45, C14_225, C14_135, C14_315). By utilizing a quadrant selection control from the Clock Data Recovery (CDR), the complementary clock are configured to be shifted from the first quadrant to the second quadrant. Altering quadrant mapping for one of the mixer sets is feasible if the current relationship between these two sets is known, enabling flexible management of phase characteristics. The clock mapping for RX-PI Mixer in phase detection and quadrant selection can involve organizing the incoming signal's phase information into distinct quadrants to facilitate accurate phase detection and adjustment. The process is essential for the Phase Interpolator (PI) within the receiver (RX) chain, where the mixer down converts the received signal. The system is configured to identify and adjust the phase of the signal by dividing the 360-degree phase cycle into four quadrants. This quadrant selection enhances the accuracy of phase detection, allowing the receiver to effectively interpret the signal's phase and maintain signal integrity, which is crucial for high-performance communication systems.

Figure 6A:
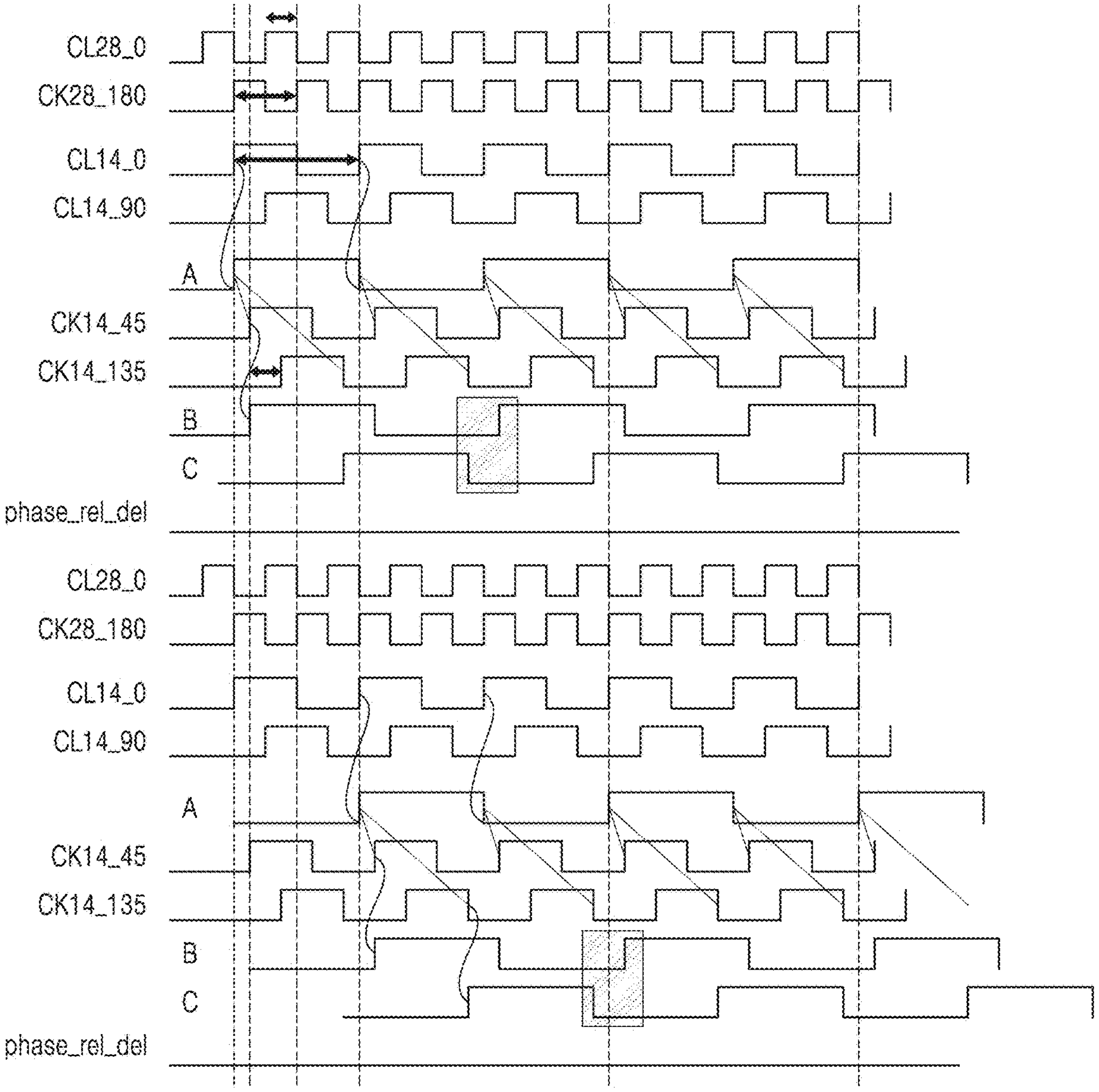
FIGS. 6A and 6B depicts a timing diagram for clock phase sequence detection, according to some example embodiments as disclosed herein.
Figure 6B:
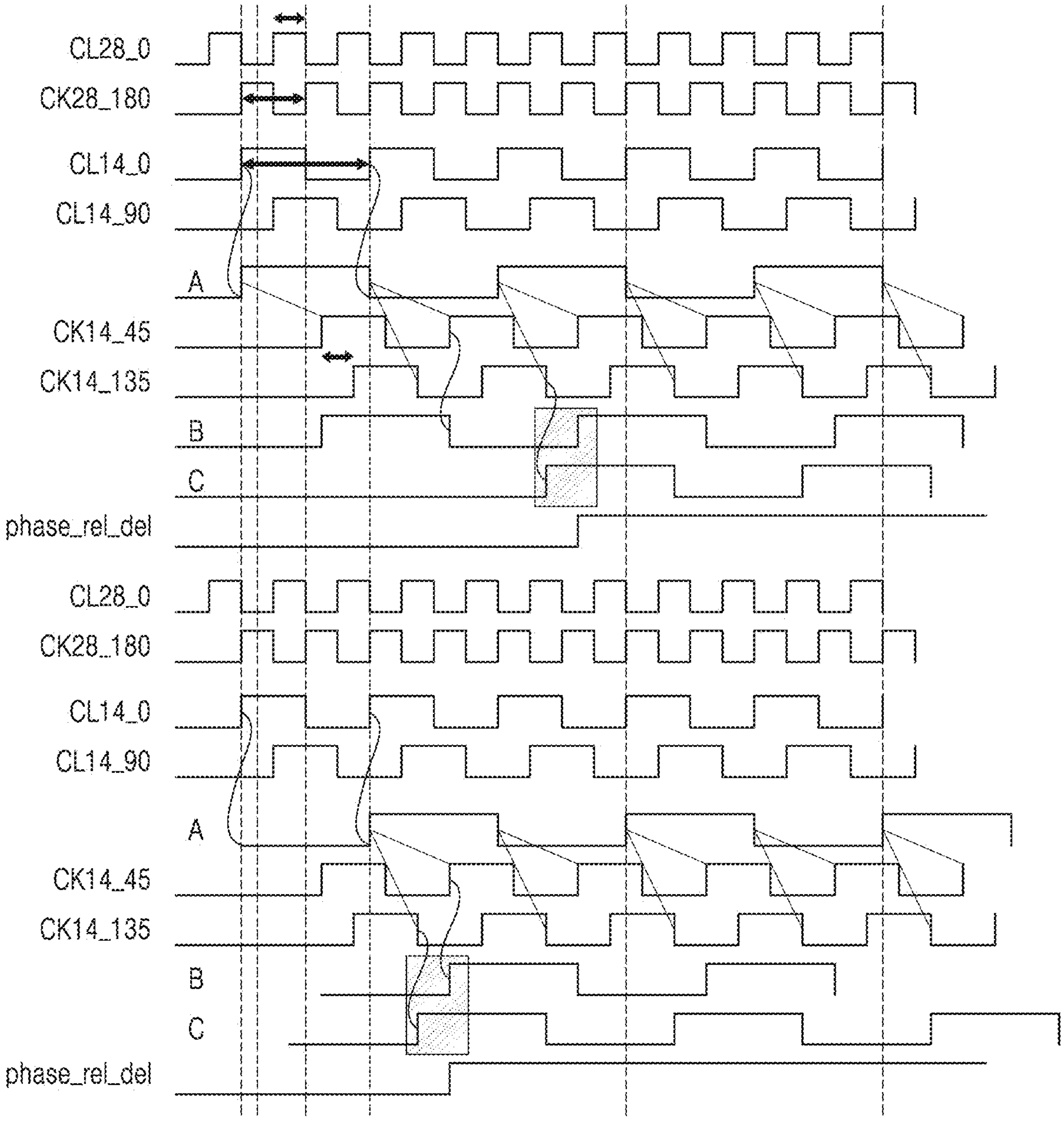

FIGS. 6A and 6B depict a timing diagram for clock phase sequence detection. The plurality of phase interpolators can be configured to generate at least one complementary clock with a phase in one of four quadrants, wherein the phase depends on phase range of the plurality of clock signals. The phase position of the at least one complementary clock in one of four quadrants can be controlled by one or more phase control bits from the CDR. FIGS. 6A and 6B depict clock phase sequence detection for two different scenarios with respect to C14_0, C14_45, or C14_135. The detection comprises dividing the C14_0 clock by 2 to create window of detection (A), sampling A by C14_45 clock net name (B), sampling A by C14_135 clock (net name) (C), and detecting C with respect to B. The detector output can be zero if C lags B. The detector output can be 1, if C leads B. The described system features a plurality of phase interpolators configured to generate at least one complementary clock positioned within one of four quadrants, dependent on the phase range of the clock signals. The phase position of these clocks is governed by phase control bits from the Clock Data Recovery (CDR).

FIGS. 6A and 6B depict the process for clock phase sequence detection under two scenarios involving C14_0, C14_45, or C14_135. The detection can involve dividing the C14_0 clock by 2 to create a detection window (A), sampling A by C14_45 clock (labeled as B), sampling A by C14_135 clock (labeled as C), and finally, detecting C with respect to B. The detector output indicates 0 if C lags B. The detector output indicates 1 if C leads B. The timing diagram for clock phase sequence detection illustrates the temporal relationship between different clock phases in a sequence, crucial for ensuring synchronization and accurate phase detection in digital systems. FIGS. 6A and 6B depict multiple clock signals, each offset by a specific phase angle, and highlights the transitions and timing intervals where phase comparisons occur. By visually representing the phase shifts and overlaps, the timing diagram can help in understanding how the system detects and aligns the phases of incoming signals. This is particularly important in applications like phase-locked loops (PLLs) and clock data recovery circuits, where precise phase sequence detection is essential for maintaining data integrity and synchronization in high-speed digital communications.

Figure 7:
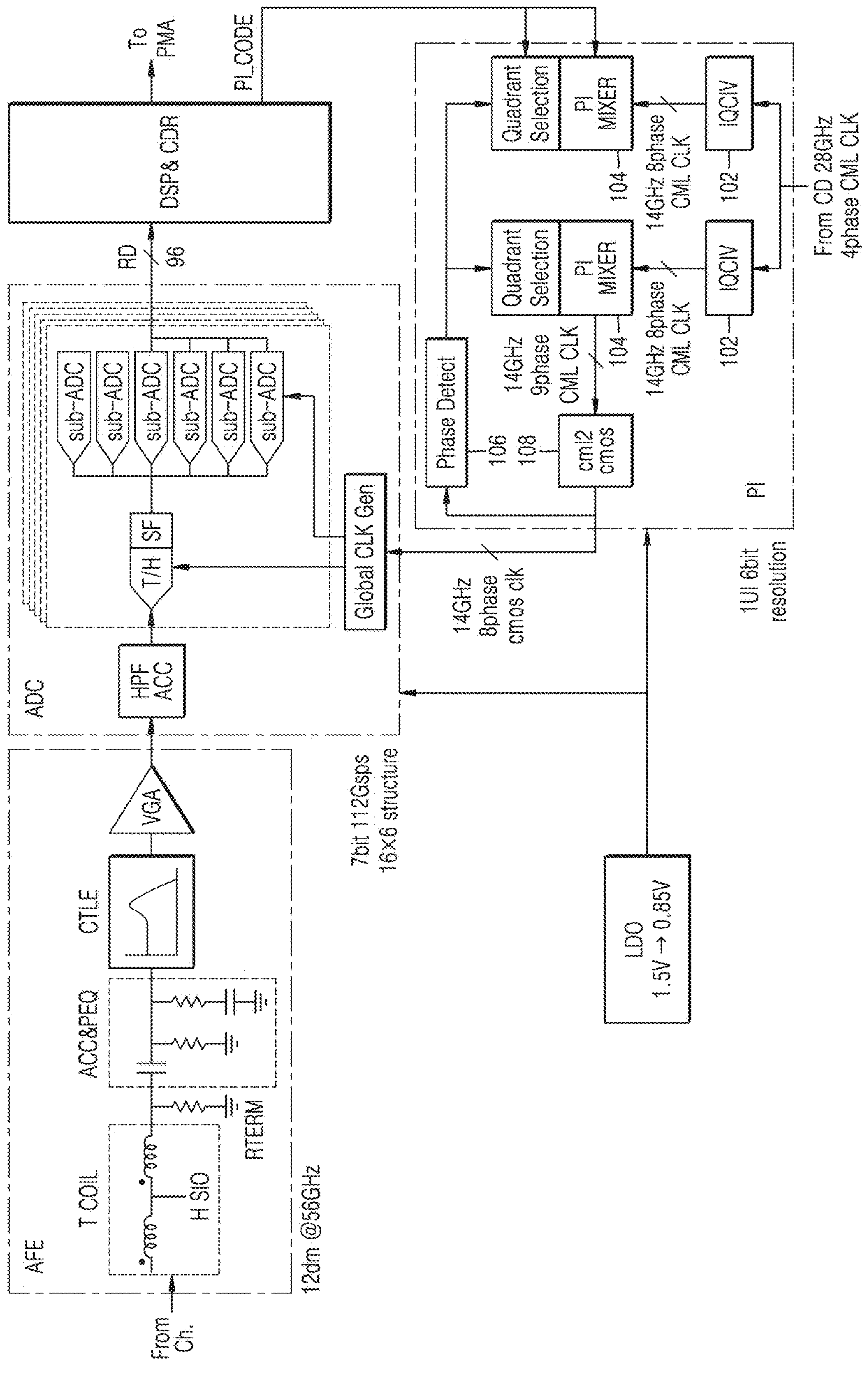
FIG. 7 depicts a high-speed serial link/SerDes PHY high-speed ADC clock receiver, according to some example embodiments as disclosed herein.

FIG. 7 depicts a high-speed serial link/SerDes PHY high-speed ADC clock receiver. In high-speed serial links or Serializer/Deserializer (SerDes) PHYs, a high-speed ADC clock receiver converts high-frequency analog signals into digital data for further processing. The clock receiver ensures accurate timing and synchronization, essential for the proper functioning of the high-speed ADC (Analog-to-Digital Converter). The clock receiver captures the high-speed serial data streams, providing precise clock signals that guide the ADC in sampling the incoming analog signals at the correct moments. This process enables reliable data transmission and reception over serial links, which is crucial for applications requiring high bandwidth and low latency, such as in data centers, telecommunications, and high-performance computing systems. The illustration depicts a phase sequence circuit for a high-speed ADC clock receiver for PAM4 receiver comprises a plurality of current-mode logic (CML) IQ dividers (102), a plurality of phase interpolators (104), a plurality of CML to Complementary Metal-Oxide-Semiconductor (CMOS) converters (108), and a detector circuit (106). The plurality of current-mode logic (CML) IQ dividers can operatively control the plurality of phase interpolators (104). The plurality of phase interpolators (104) are configured to be functionally connected to a plurality of clocks to generate a complementary clock in a predefined phase range in the input clock in the predicted plurality of quadrants, wherein the plurality of clocks and the complementary clocks are used to determine the phase relation among the predefined phase range in the input clock signals coming from the plurality of CML IQ dividers (102).

As shown in the FIG. 7, the phase sequence circuit for a high-speed ADC clock receiver for PAM4 receiver (including the plurality of current-mode logic (CML) IQ dividers (102), the plurality of phase interpolators (104), the plurality of CML to Complementary Metal-Oxide-Semiconductor (CMOS) converters (108), and the detector circuit (106)) is operationally connected to an Analog-to-Digital converter (ADC) including a plurality of sub-ADCs) in order to control the conversion of an analog signal received from an analog front end (AFE). The output of the ADC (including the converted signal) is then forwarded to a digital signal processor (DSP) and a clock and data recovery (CDR) circuit. An output of the DSP and/or CDR may be forwarded to, e.g., a processor for further processing and/or to the phase sequence circuit as a feedback control signal.

Figure 8:
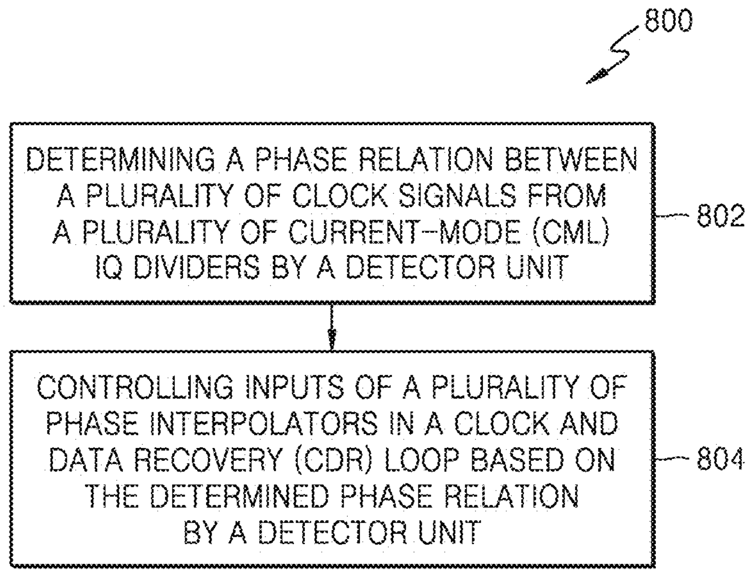
FIG. 8 depicts a method for managing phase for a high-speed ADC clock receiver in a PAM4 receiver, according to some example embodiments as disclosed herein.

FIG. 8 depicts a method for managing phase for a high-speed ADC clock receiver in a PAM4 receiver. In the method (800), the detector circuit is configured to determine a phase relation between a plurality of clock signals from a plurality of current-mode logic (CML) IQ dividers (802) and control the inputs of a plurality of phase interpolators in a clock and data recovery (CDR) loop based on the determined phase relation (804) and therefore control the phase position of the clock, e.g., in one of four quadrants without a shared reset, and thereby reducing (and/or preventing) misalignment caused by the shared reset.

In an embodiment herein, the detector circuit determines the phase relationship between the plurality of clock signals based on complementary metal-oxide-semiconductor (CMOS) level of outputs of the plurality of phase interpolators.

In an embodiment herein, the one or more phase control bits from the CDR can control the phase position of the at least one complementary clock in one of four quadrants.

Embodiments as disclosed herein the at least one complementary clock can be moved from a first quadrant to a second quadrant, based on a quadrant selection control from the CDR.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of embodiments and examples, those skilled in the art will recognize that the embodiments and examples disclosed herein can be practiced with modification within the scope of the embodiments as described herein.

What is claimed is:

1. A circuit configured to manage phase for a high-speed analog-to-digital converter (ADC) clock receiver in a pulse-amplitude modulation (PAM) receiver, comprising:

one or more Current-Mode Logic (CML) in-phase/quadrature (IQ) dividers;

a plurality of phase interpolators;

one or more CML to Complementary Metal-Oxide-Semiconductor (CMOS) converters connected to an output of at least one of the plurality of phase interpolator; and a detector circuit configured to determine a phase relation between a plurality of clock signals received from the one or more CML IQ dividers, and control inputs of the plurality of phase interpolators in a Clock and Data Recovery (CDR) loop based on the determined phase relation.

2. The circuit, as claimed in claim 1, wherein the detector circuit is configured to determine the phase relation between the plurality of clock signals based on CMOS level outputs of the one or more CML to CMOS converters.

3. The circuit, as claimed in claim 1, wherein the one or more CML IQ dividers is configured to control the plurality of phase interpolators.

4. The circuit, as claimed in claim 3, wherein the plurality of phase interpolators is configured to generate at least one complementary clock with a phase in one of four quadrants, and the phase is based on a phase range of the plurality of clock signals.

5. The circuit, as claimed in claim 4, wherein a position of the phase of the at least one complementary clock is controlled by one or more phase control bits output from the CDR loop.

6. The circuit, as claimed in claim 4, wherein at least one complementary clock is moved from a first quadrant to a second quadrant, based on a quadrant selection control output from the CDR loop.

7. A method for managing phase for a high-speed clock for an analog-to-digital-converter-digital signal processor (ADC-DSP) based receiver in a pulse-amplitude modulation (PAM) receiver, the method comprising:

determining, by a detector circuit, a phase relation between a plurality of clock signals received from a plurality of Current-Mode Logic (CML) in-phase/quadrature (IQ) dividers; and controlling, by the detector circuit, inputs of a plurality of phase interpolators in a Clock and Data Recovery (CDR) loop based on the determined phase relation.

8. The method, as claimed in claim 7, wherein the determining the phase relation includes determining the phase relation between the plurality of clock signals based on Complementary Metal-Oxide-Semiconductor (CMOS) level outputs of one or more CML to CMOS converters.

9. The method, as claimed in claim 7, wherein the method further includes, operatively controlling, by the plurality of CML IQ dividers, the plurality of phase interpolators.

10. The method, as claimed in claim 9, wherein the method comprises generating, by the plurality of phase interpolators, at least one complementary clock with a phase in one of four quadrants, wherein the phase depends on a phase range of the plurality of clock signals.

11. The method, as claimed in claim 10, wherein a position of the phase of the at least one complementary clock in the four quadrants is controlled by one or more phase control bits from the CDR loop.

12. The method, as claimed in claim 11, wherein at least one complementary clock is moved from a first quadrant to a second quadrant, based on a quadrant selection control from the CDR loop.

* * * * *